(12) United States Patent
Chen et al.

(10) Patent No.: US 7,075,176 B2
(45) Date of Patent: Jul. 11, 2006

(54) CHIP PACKAGE SUBSTRATE HAVING SOFT CIRCUIT BOARD AND METHOD FOR FABRICATING THE SAME

(75) Inventors: Huei-Jen Chen, Yungho (TW); Evan Liu, Yungho (TW); Yvon Chen, Hsichih (TW)

(73) Assignee: Lite-On Semiconductor Corp., Taipei (TW)

( * ) Notice: Subject to any disclaimer, the term of this patent is extended or adjusted under 35 U.S.C. 154(b) by 0 days.

(21) Appl. No.: 11/188,653

(22) Filed: Jul. 26, 2005

(65) Prior Publication Data

US 2006/0006487 A1    Jan. 12, 2006

Related U.S. Application Data

(62) Division of application No. 10/655,223, filed on Sep. 5, 2003.

(30) Foreign Application Priority Data

Jul. 2, 2003    (TW) ................ 92118123 A

(51) Int. Cl.
    *H02L 23/02*    (2006.01)
(52) U.S. Cl. ............ 257/680; 257/702; 257/730; 361/749

(58) Field of Classification Search ........ 257/701–703, 257/730, 680; 361/749
See application file for complete search history.

(56) References Cited

U.S. PATENT DOCUMENTS

| 5,473,119 A * | 12/1995 | Rosenmayer et al. ....... 174/255 |
| 6,815,729 B1 * | 11/2004 | Brophy et al. ............. 257/98 |
| 2002/0126460 A1 * | 9/2002 | Heismann et al. ......... 361/749 |

\* cited by examiner

*Primary Examiner*—Leonardo Andujar
*Assistant Examiner*—Krista Soderholm
(74) *Attorney, Agent, or Firm*—Birch, Stewart, Kolasch, and Birch, LLP

(57) ABSTRACT

A chip package substrate having a soft circuit board jas a multi-layer soft and hard composite PCB, a plurality of conducting components and a plurality of conducting holes. The conducting holes are formed in the multi-layer soft and hard composite PCB. The conducting components are electroplated on the inner edges of the conducting holes on the multi-layer soft and hard composite PCB. An image-sensing chip can thus be packaged on the chip package substrate with the soft circuit board used as external signal connection lines, thereby saving the manufacturing cost and increasing the yield thereof.

3 Claims, 7 Drawing Sheets

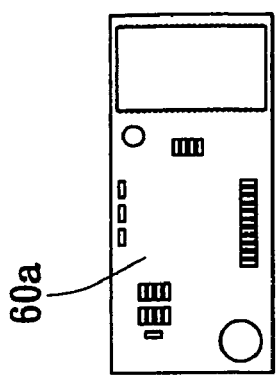
FIG. 1A
PRIOR ART
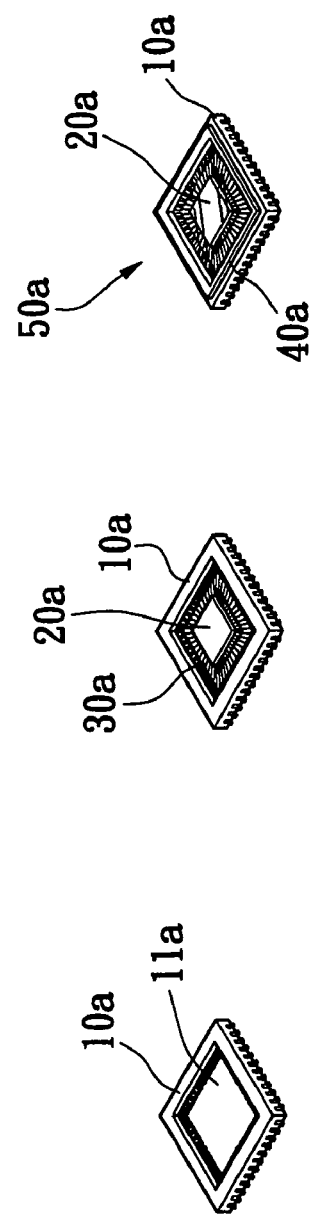
FIG. 1B
PRIOR ART
FIG. 1C
PRIOR ART
FIG. 1D
PRIOR ART
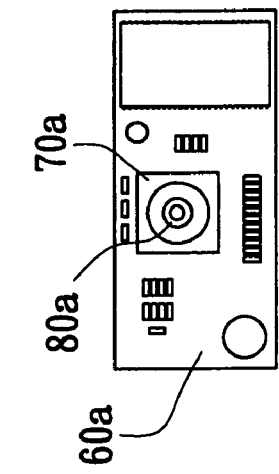
FIG. 1F
PRIOR ART
FIG. 1G
PRIOR ART
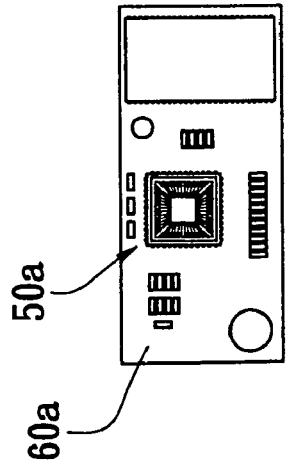
FIG. 1E
PRIOR ART

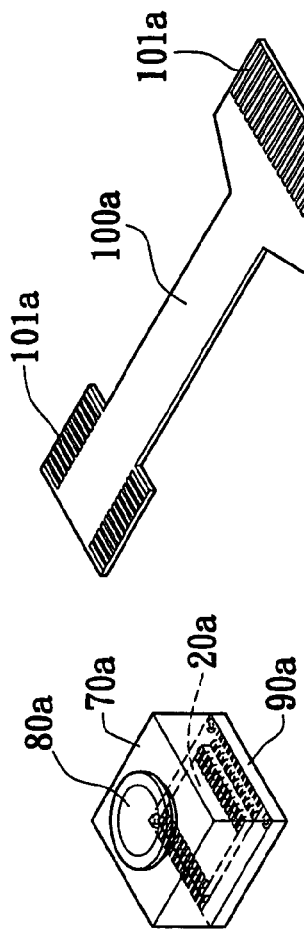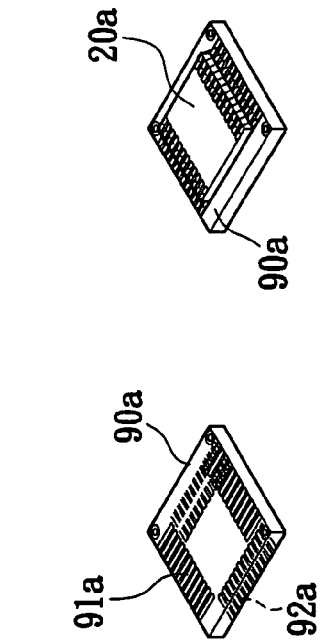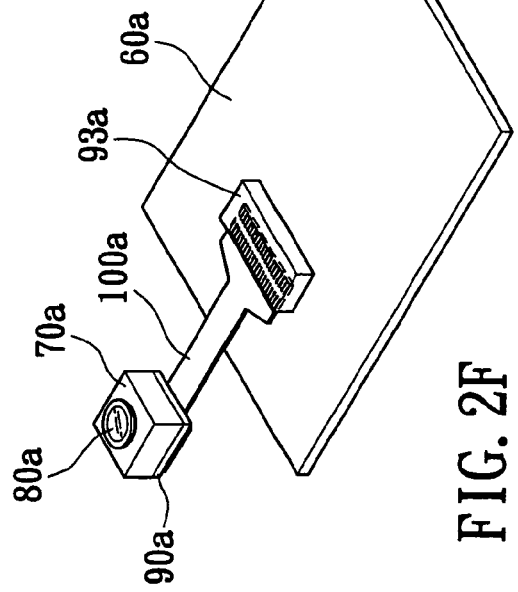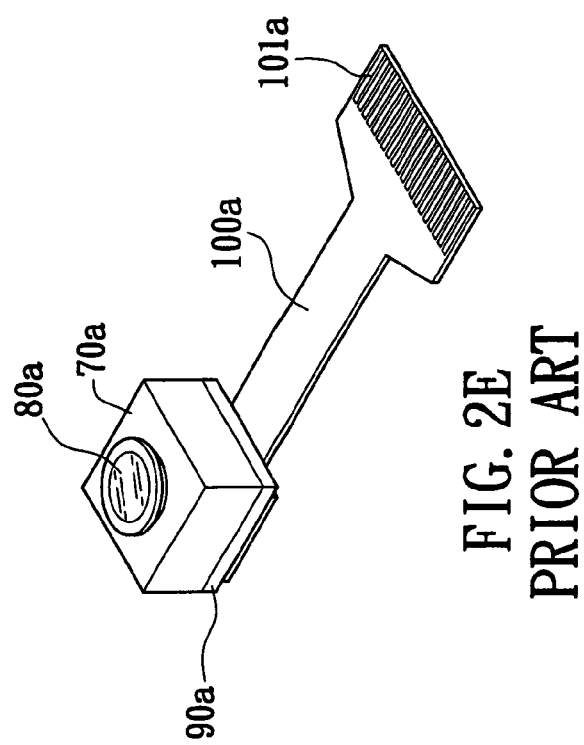

CHIP PACKAGE SUBSTRATE HAVING SOFT CIRCUIT BOARD AND METHOD FOR FABRICATING THE SAME

This application is a Divisional of co-pending application Ser. No. 10/655,223 filed on Sep. 5, 2003, and for which priority is claimed under 35 U.S.C. § 120; and this application claims priority of application Ser. No. 092118123 filed in Taiwan, R.O.C. on Jul. 2, 2003 under 35 U.S.C. § 119; the entire contents of all are hereby incorporated by reference.

FIELD OF THE INVENTION

The present invention relates to a chip package substrate having a soft circuit board and a method for manufacturing the same and, more particularly, to a chip package substrate with a soft circuit board formed on a soft and hard composite circuit board to be used as external signal connection lines.

BACKGROUND OF THE INVENTION

A common chip needs to be packaged and then electrically connected with an electronic board to be installed in an electronic device. In particular, an image-sensing chip needs to be protected by a package body and then electrically connected with an electronic board for operation.

FIGS. 1A to 1G show the method for electrically connecting an image-sensing chip like a CCD or a CMOS sensor with an electronic board. First, a ceramic package substrate 10a is prepared. A groove 11a is formed in the upper side of the ceramic package substrate 10a. An image-sensing chip 20a is then adhered in the groove 11a of the ceramic package substrate 10a. Electric connection lines 30a are then used to electrically connect the ceramic package substrate 10a and the image-sensing chip 20a. Next, a transparent board 40a is attached on the upper side of the ceramic package substrate 10a to package the image-sensing chip 20a. A package body 50a having the image-sensing chip 20a is then adhered to an electronic board 60a by means of surface mount technology (SMT). Finally, a lens seat 70a and a lens 80a are then assembled on the package body 50a to finish an image detection module.

FIGS. 2A to 2F show another method for assembling an image-sensing chip into an image detection module. First, a hard PCB 90a is manufactured with a plurality of solder pads 91a thereon. The image-sensing chip 20a is adhered on the upper side of the hard PCB 90a. The electric connection lines 30a are then used to electrically connect the image-sensing chip 20a and the solder pads 91a. The lens seat 70a and the lens 80a are then assembled on the hard PCB 90a to package the image-sensing chip 20a on the hard PCB 90a. The lower end face of the hard PCB 90a has a plurality of electric connection sheets 92a. A soft circuit board 100a having comb-shaped electric connection sheets 101a at two ends thereof is also prepared. The comb-shaped electric connection sheet 101a at one end of the soft circuit board 100a is stained with conducting glue to be pressed and adhered to the electric connection sheet 92a at the lower end face of the hard PCB 90a. The comb-shaped electric connection sheet 101a at the other end of the soft circuit board 100a is also stained with conducting glue to be pressed and adhered to the electronic board 60a or via a connector 93a, thereby forming an image detection module.

However, the above methods for assembling an image-sensing chip into an image detection module have the following drawbacks:

1. Because the price of the ceramic package substrate is high, the material cost is thus increased. Moreover, because it is necessary to connect the package body having the image-sensing chip firmly on the electronic board, the installation flexibility of the package body is thus reduced.
2. Because the comb-shaped electric connection sheet and the electric connection sheet of the hard PCB are glued together with conducting glue on a small area, the adhesion strength is low.
3. When the hard PCB and the soft circuit board having comb-shaped electric connection sheets are glued together, the comb-shaped electric connection sheet may be not completely pressed on the hard PCB due to unevenness of the end face of the hard PCB having the electric connection sheet, hence reducing the adhesion strength. Moreover, it is necessary to use a microscope to view and align the adhesion portion of the two components, hence increasing the manufacturing time and wasting manpower. Also, the conductivity of the conducting glue is reduced after a period of time at room temperature, hence lowering the yield.

SUMMARY OF THE INVENTION

One object of the present invention is to provide a chip package substrate having a soft circuit board and a method for manufacturing the same, in which a package PCB and soft electric connection lines of an image-sensing chip are simultaneously finished for a single manufacturing process to simplify the electric connection process after chip packaging, reduce manual operations, and increase the yield thereof.

Another object of the present invention is to provide a chip package substrate having a soft circuit board, in which the size of the substrate and the soft electric connection lines are reduced to lower the cost.

Yet another object of the present invention is to provide a chip package substrate having a soft circuit board, in which soft electric connection lines are adhered on the chip package substrate with a larger area to enhance the adhesion strength and also increase the yield thereof To achieve the above objects, the present invention provides a chip package substrate having a soft circuit board. The chip package substrate is used to package an image-sensing chip. The soft circuit board is used as external signal connection lines. The chip package substrate having a soft circuit board comprises a multi-layer soft and hard composite PCB, a plurality of conducting components and a plurality of conducting holes. The conducting holes are formed on the multi-layer soft and hard composite PCB. The conducting components are electroplated on the inner edges of the conducting holes on the multi-layer soft and hard composite PCB. An image-sensing chip can thus be packaged on the chip package substrate with the soft circuit board used as external signal connection lines to reduce the manufacturing cost and increase the yield thereof.

Moreover, the present invention also provides a method for manufacturing a chip package substrate having a soft circuit board. The method comprises providing a multi-layer soft and hard composite PCB and removing predetermined portions of the multi-layer soft and hard composite PCB to form the chip package substrate having a soft circuit board on the multi-layer soft and hard composite PCB.

BRIEF DESCRIPTION OF THE DRAWINGS

The various objects and advantages of the present invention will be more readily understood from the following detailed description when read in conjunction with the appended drawings, in which:

FIGS. 1A to 1G show the flowchart of a conventional method of electrically connecting an image-sensing chip with an electronic board;

FIGS. 2A to 2F show the flowchart of another conventional method of electrically connecting an image-sensing chip with an electronic board;

DETAILED DESCRIPTION OF THE PREFERRED EMBODIMENTS

Figure 3:
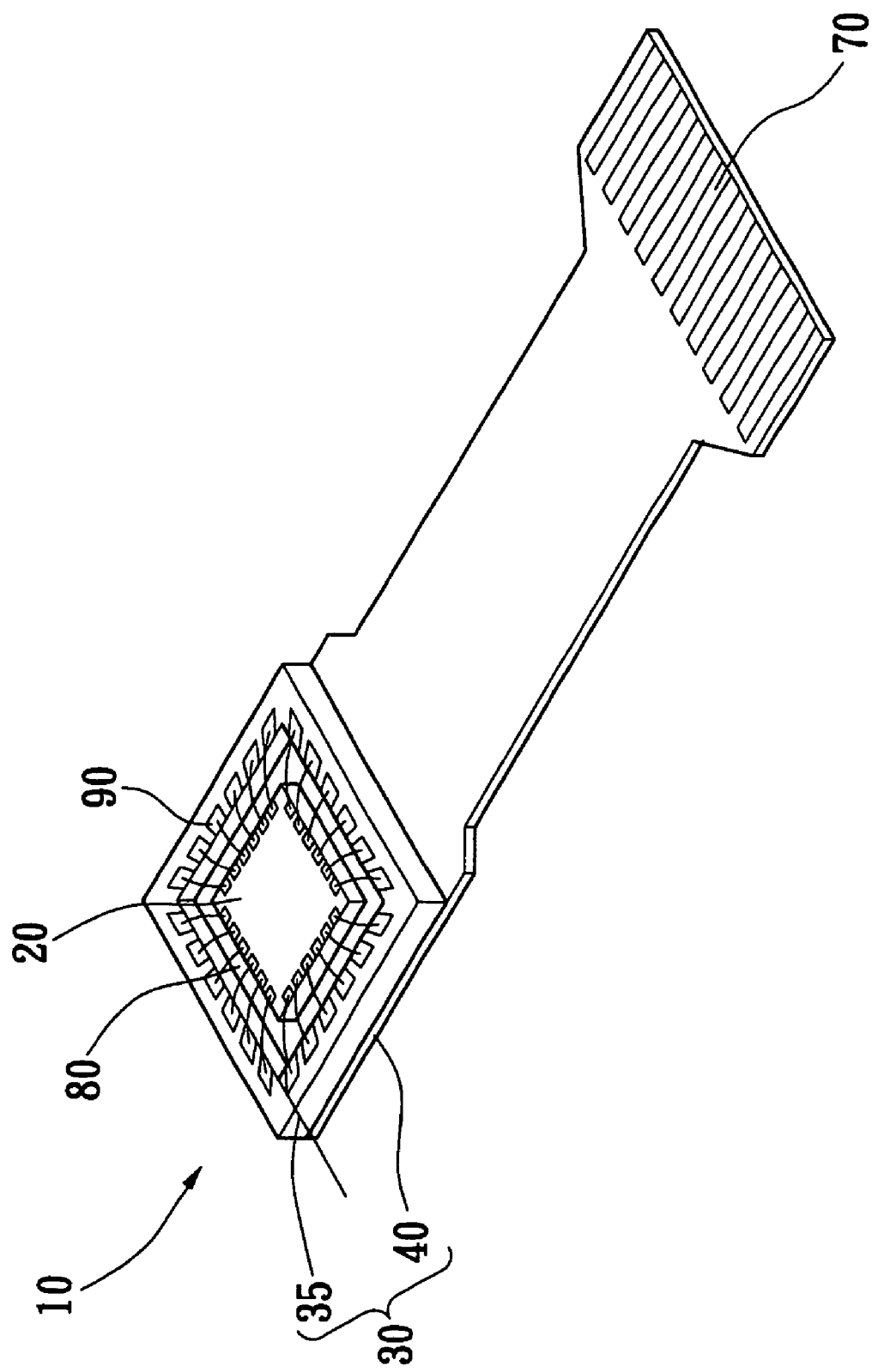
FIG. 3 is a perspective view of a chip package substrate having a soft circuit board of the present invention.

As shown in FIG. 3, the present invention provides a soft circuit board and a method for manufacturing the same. An image-sensing chip is packaged on the chip package substrate. The soft circuit board is used as external signal connection lines to connect an electronic board for forming an image detection module thereto. The method for manufacturing the chip package substrate having a soft circuit board provides manufacturing of the chip package substrate having a soft circuit board before chip packaging, hence simplifying the adhesion process of the soft circuit board after the chip is packaged on the chip package substrate.

Figure 4:
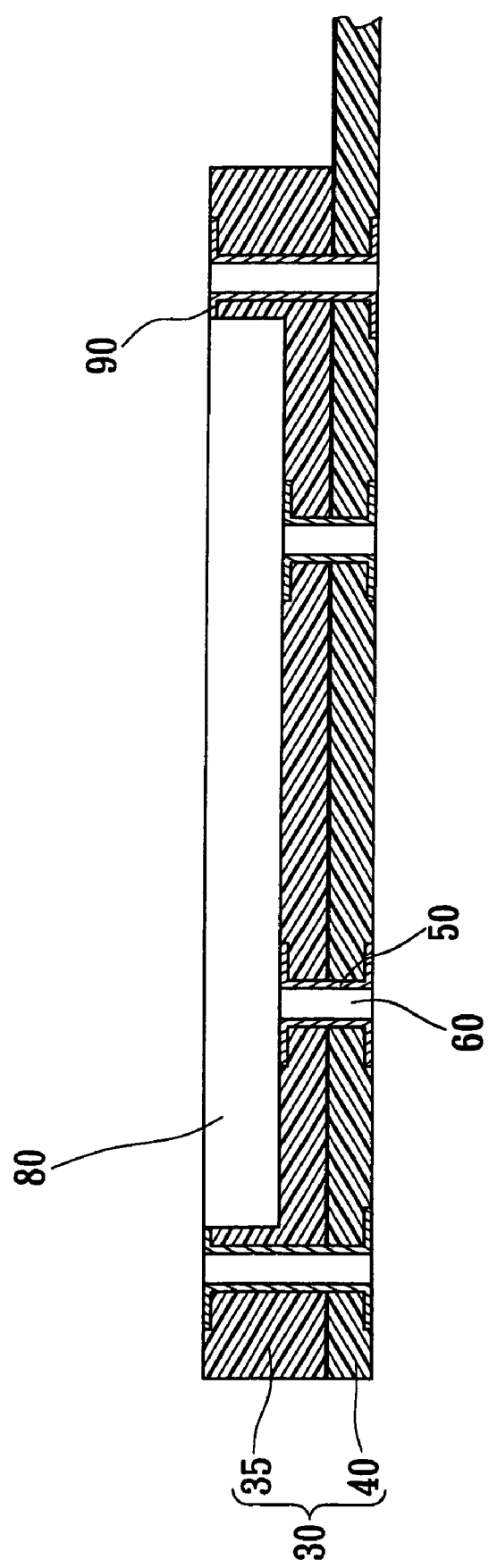
FIG. 4 is a cross-sectional view of a chip package substrate having a soft circuit board of the present invention.

As shown in FIGS. 3 and 4, a chip package substrate 10 having a soft circuit board is used to package an image-sensing chip 20. The soft circuit board is used as external signal connection lines. The chip package substrate 10 comprises a multi-layer soft and hard composite PCB 30, a plurality of conducting components 50 and a plurality of conducting holes 60. The multi-layer soft and hard composite PCB 30 comprises a multi-layer hard PCB 35 and at least a soft circuit board 40, which are adhered together to form the multi-layer soft and hard composite PCB 30. The soft circuit board 40 is extended out of the multi-layer hard PCB 35. One end of the soft circuit board 40 extending out of the multi-layer hard PCB 35 has a comb-shaped electric connection sheet 70. A groove 80 is formed in the upper side of the multi-layer hard PCB 35 of the multi-layer soft and hard composite PCB 30. A plurality of solder pads 90 is distributed on the upper surface of the periphery of the multi-layer soft and hard composite PCB 30 and connects part of the conducting components 50 to connect electrically the image-sensing chip 20. The conducting holes 60 are formed on the multi-layer hard PCB 35 and the soft circuit board 40. The conducting components 50 are electroplated on inner edges of the conducting holes 60 on the multi-layer hard PCB 35 and the soft circuit board 40 to connect electrically the multi-layer hard PCB 35 and the soft circuit board 40. The image-sensing chip 20 can thus be packaged in the groove 80 on the multi-layer soft and hard composite PCB 30. The soft circuit board 40 can also be used to electrically connect an electronic board to form an image detection module.

Figure 5:
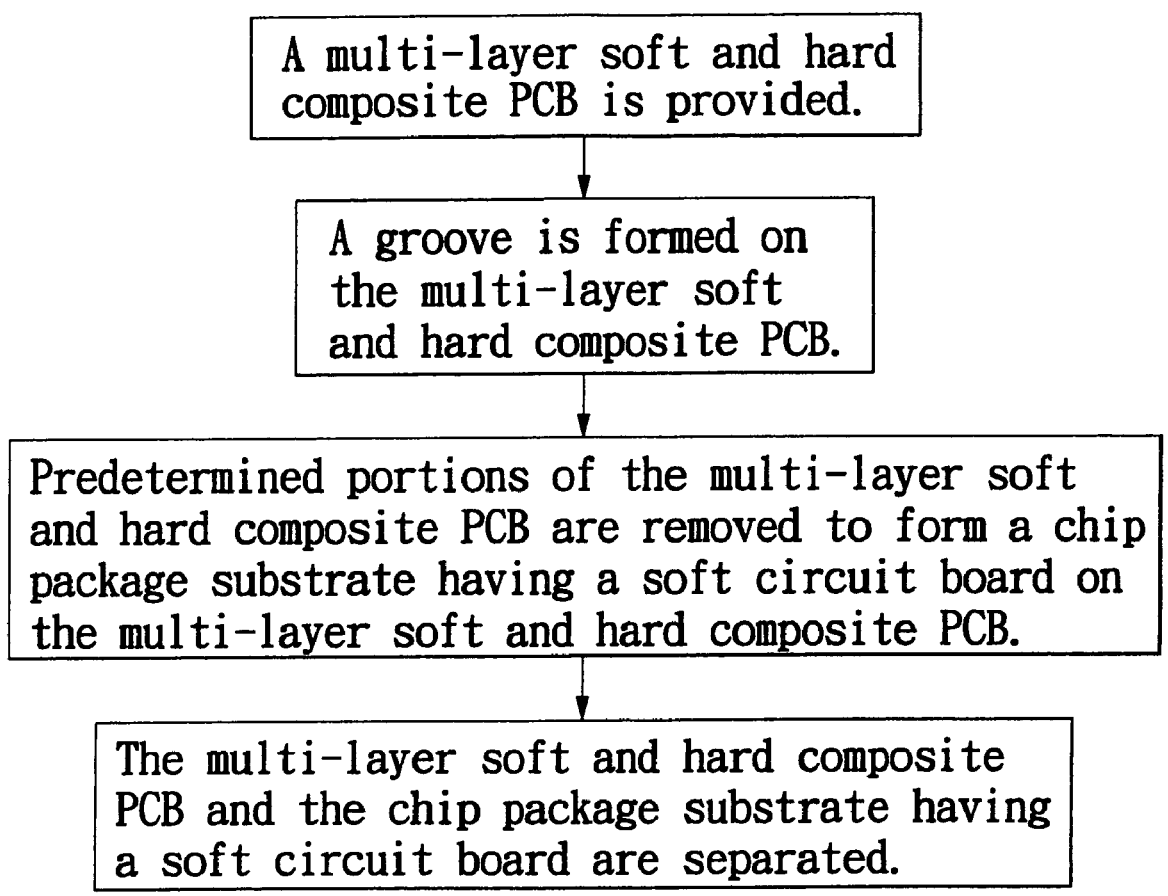
FIG. 5 is the flowchart of a method for manufacturing a chip package substrate having a soft circuit board of the present invention.
Figure 6:
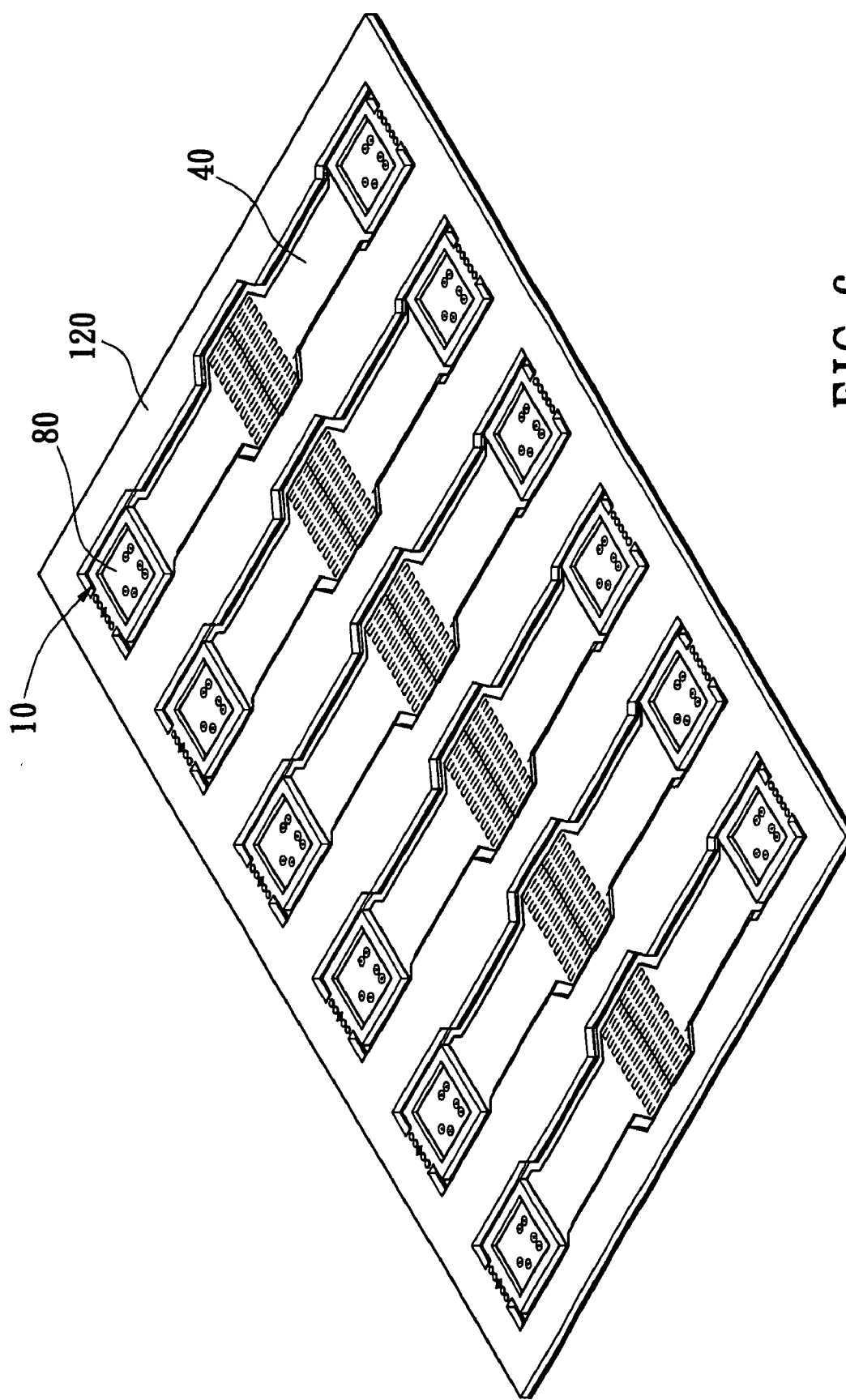
FIG. 6 is a perspective view of a chip package substrate having a soft circuit board on a multi-layer soft and hard composite PCB of the present invention.
Figure 7A:
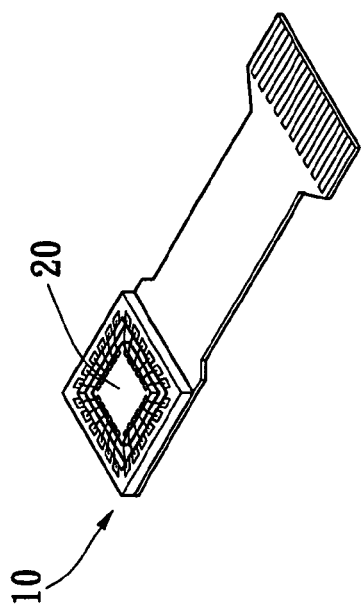
FIGS. 7A to 7D show the flowchart of a method of electrically connecting an image-sensing chip with an electronic board of the present invention.
Figure 7B:
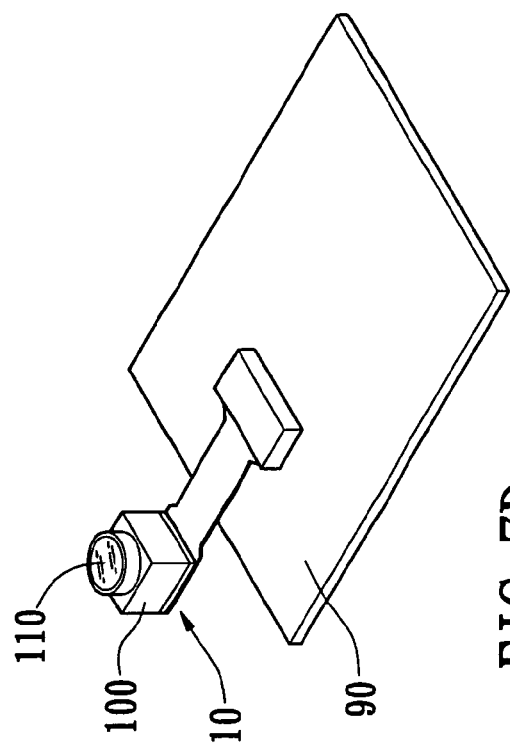
Figure 7C:
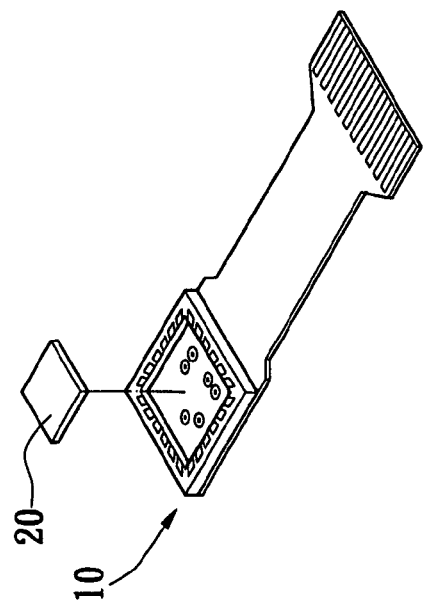
Figure 7D:
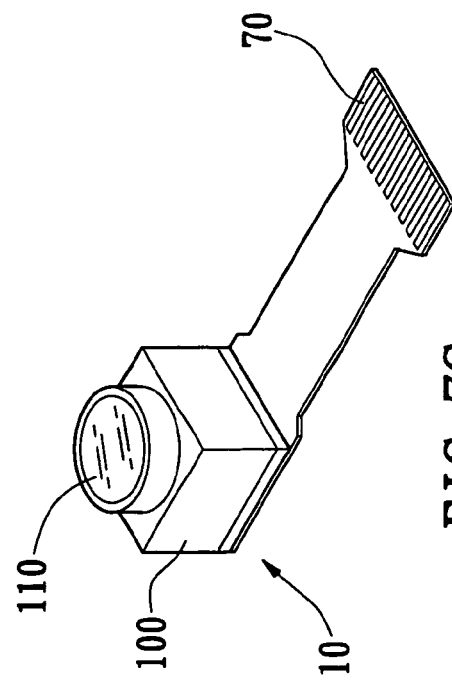

FIGS. 5 and 6 show the method for manufacturing a chip package substrate having a soft circuit board. The method comprises the steps of:

A. providing a multi-layer soft and hard composite PCB 120, which comprises a plurality of hard PCBs and at least a soft circuit board;

B. forming a groove 80 on the multi-layer soft and hard composite PCB 120;

C. removing predetermined portions of the multi-layer soft and hard composite PCB to form the chip package substrate 10 having a soft circuit board on the multi-layer soft and hard composite PCB 120, hence packaging an image-sensing chip on the chip package substrate and using the soft circuit board as external signal connection lines; and D. separating the multi-layer soft and hard composite PCB 120 and the chip package substrate 10 having a soft circuit board.

The multi-layer soft and hard composite PCB 120 can be used to simultaneously manufacture a plurality of chip package substrates 10 having a soft circuit board. The groove 80 is formed on the multi-layer soft and hard composite PCB 120. Predetermined portions of the multi-layer soft and hard composite PCB 120 are then removed by drilling or milling to form a plurality of two opposite chip package substrates 10 having a soft circuit board on the multi-layer soft and hard composite PCB 120. The soft circuit boards 40 of the chip package substrates 10 having a soft circuit board are opposed to one another and are connected together intermittently. The chip package substrates 10 having a soft circuit board are connected on the multi-layer soft and hard composite PCB 120 in a partially intermittent connection to facilitate separation of the chip package substrates 10 having a soft circuit board and the multi-layer soft and hard composite PCB 120 when in use.

As shown in FIGS. 7A to 7D, the image-sensing chip 20 is electrically connected to the chip package substrate 10 having a soft circuit board. A lens seat 100 and a lens 110 are used to package the image-sensing chip 20 on the multi-layer hard PCB 35. The comb-shaped electric connection sheet 70 at one end of the soft circuit board 40 is electrically connected to the electronic board 90 to form an image detection module, which can then be applied in a video phone, a personal digital assistant (PDA), a smart phone, a handheld device or a portable personal computer (PC) for picking up images and storing them in the device.

To sum up, the present invention provides a chip package substrate having a soft circuit board and a method for manufacturing the same, in which a package PCB and soft electric connection lines of an image-sensing chip are simultaneously finished for a single manufacturing process to simplify the electric connection process after chip packaging, reduce manual operations, and increase the yield thereof. Moreover, the size of the substrate and the soft electric connection lines are reduced to lower the cost. Further, soft electric connection lines are adhered on the chip package substrate with a larger area to enhance the adhesion strength and also increase the yield thereof.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A chip package substrate with a soft circuit board, for receiving an image-sensing chip packaged thereon, a lens seat with a lens mounted on said image-sensing chip, said image-sensing chip having a plurality of contacts respectively formed on a top surface and a bottom surface thereof, said chip package substrate comprising:
   a multi-layer soft and hard composite PCB comprising a multi-layer hard PCB, at least a soft circuit board and a plurality of conducting holes, said soft circuit board having two ends, said multi-layer hard PCB fixed on a top surface of one end of said soft circuit board, and the other end of said soft circuit board electrically connecting to an electrical connector, said conducting holes penetrating from a top surface of said multi-layer hard PCB to a bottom surface of said soft circuit board; and
   a plurality of conducting components electroplated on inner walls of said corresponding conducting holes from the top surface of said multi-layer hard PCB to the bottom surface of said soft circuit boards, the conducting components respectively contacting said contacts on the bottom surface of said image-sensing chip and electrically connecting said multi-layer hard PCB to the contacts on the top surface of said image-sensing chip.

2. The chip package substrate with a soft circuit board as claimed in claim 1, wherein a concave groove is formed in an upper central surface of said multi-layer hard PCB for receiving said image-sensing chip, and the conducting components respectively located in said groove and around said groove.

3. The chip package substrate with a soft circuit board as claimed in claim 2, wherein said multi-layer hard PCB has a plurality of solder pads, distributed on an upper surface thereof which connect with said conducting components, said solder pads being arranged around the groove of said multi-layer hard PCB and electrically connecting to the contacts on the top surface of said image-sensing chip by bond wires.

* * * * *